(12) United States Patent
Marsh et al.

(10) Patent No.: US 8,294,139 B2
(45) Date of Patent: Oct. 23, 2012

(54) MULTILAYER ANTIREFLECTION COATINGS, STRUCTURES AND DEVICES INCLUDING THE SAME AND METHODS OF MAKING THE SAME

(75) Inventors: Eugene P. Marsh, Boise, ID (US); Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1050 days.

(21) Appl. No.: 11/766,663

(22) Filed: Jun. 21, 2007

(65) Prior Publication Data

US 2008/0315270 A1  Dec. 25, 2008

(51) Int. Cl.
 *H01L 35/24* (2006.01)
(52) U.S. Cl. .............. 257/40; 257/79; 257/290
(58) Field of Classification Search .......... 257/40, 257/79, 290
See application file for complete search history.

(56) References Cited

U.S. PATENT DOCUMENTS

| | | |
|---|---|---|
| 4,797,357 A | 1/1989 | Mura et al. |
| 5,512,131 A | 4/1996 | Kumar et al. |
| 5,580,700 A | 12/1996 | Rahman |
| 5,620,850 A | 4/1997 | Bamdad et al. |
| 5,772,905 A | 6/1998 | Chou |
| 5,879,853 A | 3/1999 | Azuma |
| 5,948,470 A | 9/1999 | Harrison et al. |
| 5,958,704 A | 9/1999 | Starzl et al. |
| 6,207,787 B1 | 3/2001 | Fahey et al. |
| 6,309,580 B1 | 10/2001 | Chou |
| 6,414,164 B1 | 7/2002 | Afzali-Ardakani et al. |
| 6,423,474 B1 | 7/2002 | Holscher |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,565,764 B2 | 5/2003 | Hiraoka et al. |
| 6,592,764 B1 | 7/2003 | Stucky et al. |
| 6,635,912 B2 | 10/2003 | Ohkubo |
| 6,656,308 B2 | 12/2003 | Hougham et al. |
| 6,679,996 B1 | 1/2004 | Yao |
| 6,780,492 B2 | 8/2004 | Hawker et al. |
| 6,812,132 B2 | 11/2004 | Ramachandrarao et al. |
| 6,825,358 B2 | 11/2004 | Afzali-Ardakani et al. |
| 6,887,332 B1 | 5/2005 | Kagan et al. |
| 6,911,400 B2 | 6/2005 | Colburn et al. |
| 6,940,485 B2 | 9/2005 | Noolandi |

(Continued)

FOREIGN PATENT DOCUMENTS

EP  1906237  2/2008

(Continued)

OTHER PUBLICATIONS

Ji et al., Molecular Transfer Printing Using Block Copolymers, ACS Nano, vol. 4, No. 2, pp. 599-609, 2010.

(Continued)

*Primary Examiner* — Anthony Ho
(74) *Attorney, Agent, or Firm* — TraskBritt

(57) ABSTRACT

Multi-layer antireflection coatings, devices including multi-layer antireflection coatings and methods of forming the same are disclosed. A block copolymer is applied to a substrate and self-assembled into parallel lamellae above a substrate. The block copolymer may optionally be allowed to self-assemble into a multitude of domains oriented either substantially parallel or substantially perpendicular to an underlying substrate.

15 Claims, 5 Drawing Sheets

U.S. PATENT DOCUMENTS

| | | | |
|---|---|---|---|
| 6,952,436 | B2 | 10/2005 | Wirnsberger et al. |
| 6,995,439 | B1 | 2/2006 | Hill et al. |
| 7,001,795 | B2 | 2/2006 | Jiang et al. |
| 7,009,227 | B2 | 3/2006 | Patrick et al. |
| 7,037,738 | B2 | 5/2006 | Sugiyama et al. |
| 7,045,851 | B2 | 5/2006 | Black et al. |
| 7,060,774 | B2 | 6/2006 | Sparrowe et al. |
| 7,087,267 | B2 | 8/2006 | Breen et al. |
| 7,112,617 | B2 | 9/2006 | Kim et al. |
| 7,115,305 | B2 | 10/2006 | Bronikowski et al. |
| 7,119,321 | B2 | 10/2006 | Quinlan |
| 7,135,241 | B2 | 11/2006 | Ferraris et al. |
| 7,151,209 | B2 | 12/2006 | Empedocles et al. |
| 7,332,370 | B2 | 2/2008 | Chang et al. |
| 7,347,953 | B2 | 3/2008 | Black et al. |
| 7,419,772 | B2 | 9/2008 | Watkins et al. |
| 7,553,760 | B2 | 6/2009 | Yang et al. |
| 7,655,383 | B2 | 2/2010 | Mela et al. |
| 7,700,157 | B2 | 4/2010 | Bronikowski et al. |
| 2001/0024768 | A1 | 9/2001 | Matsuo et al. |
| 2002/0167117 | A1 | 11/2002 | Chou |
| 2003/0034329 | A1 | 2/2003 | Chou |
| 2003/0068639 | A1 | 4/2003 | Haneder et al. |
| 2003/0080471 | A1 | 5/2003 | Chou |
| 2003/0080472 | A1 | 5/2003 | Chou |
| 2003/0108879 | A1 | 6/2003 | Klaerner et al. |
| 2003/0157248 | A1 | 8/2003 | Watkins et al. |
| 2003/0235930 | A1 | 12/2003 | Bao et al. |
| 2004/0058059 | A1 | 3/2004 | Linford et al. |
| 2004/0124092 | A1 | 7/2004 | Black et al. |
| 2004/0142578 | A1 | 7/2004 | Wiesner et al. |
| 2004/0163758 | A1 | 8/2004 | Kagan et al. |
| 2004/0256615 | A1* | 12/2004 | Sirringhaus et al. ............ 257/40 |
| 2005/0079486 | A1 | 4/2005 | Abbott et al. |
| 2005/0120902 | A1 | 6/2005 | Adams et al. |
| 2005/0238967 | A1 | 10/2005 | Rogers et al. |
| 2005/0250053 | A1 | 11/2005 | Marsh et al. |
| 2006/0035387 | A1 | 2/2006 | Wagner et al. |
| 2006/0097134 | A1 | 5/2006 | Rhodes |
| 2006/0128165 | A1 | 6/2006 | Theiss et al. |
| 2006/0134556 | A1 | 6/2006 | Nealey et al. |
| 2006/0137554 | A1 | 6/2006 | Kron et al. |
| 2006/0141245 | A1 | 6/2006 | Stellacci et al. |
| 2006/0163646 | A1 | 7/2006 | Black et al. |
| 2006/0231525 | A1 | 10/2006 | Asakawa et al. |
| 2006/0249784 | A1 | 11/2006 | Black et al. |
| 2007/0045642 | A1 | 3/2007 | Li |
| 2007/0122749 | A1 | 5/2007 | Fu et al. |
| 2007/0181870 | A1 | 8/2007 | Libertino et al. |
| 2007/0183035 | A1 | 8/2007 | Asakawa et al. |
| 2007/0281220 | A1 | 12/2007 | Sandhu et al. |
| 2008/0038923 | A1 | 2/2008 | Edelstein et al. |
| 2008/0041818 | A1 | 2/2008 | Kihara et al. |
| 2008/0047930 | A1 | 2/2008 | Blanchet et al. |
| 2008/0064217 | A1 | 3/2008 | Horii |
| 2008/0073743 | A1 | 3/2008 | Alizadeh et al. |
| 2008/0083991 | A1 | 4/2008 | Yang et al. |
| 2008/0093743 | A1 | 4/2008 | Yang et al. |
| 2008/0102252 | A1 | 5/2008 | Black et al. |
| 2008/0103256 | A1 | 5/2008 | Kim et al. |
| 2008/0113169 | A1 | 5/2008 | Cha et al. |
| 2008/0174726 | A1 | 7/2008 | Kim |
| 2008/0257187 | A1 | 10/2008 | Millward |
| 2009/0267058 | A1 | 10/2009 | Namdas et al. |
| 2009/0317540 | A1 | 12/2009 | Sandhu et al. |

FOREIGN PATENT DOCUMENTS

| | | |
|---|---|---|
| JP | 2005029779 | 3/2005 |
| JP | 2006110434 | 4/2006 |
| JP | 2007-194175 | 8/2007 |
| KR | 10-2006-0128378 | 12/2006 |
| WO | 02-18080 | 3/2002 |
| WO | 03045840 | 6/2003 |
| WO | 2006003592 | 1/2006 |
| WO | 2006003594 | 1/2006 |
| WO | 2006112887 | 10/2006 |
| WO | 20080055137 | 5/2008 |

OTHER PUBLICATIONS

Grubbs, Hybrid Metal-Polymer Composites from Functional Block Copolymers, Journal of Polymer Science: Part A: Polymer Chemistry, vol. 43, pp. 4323-4336 (2005).

Zhou et al, Nanoscale Metal/Self-Assembled Monolayer/Metal Heterostructures, American Institute of Physics, pp. 611-613 (1997).

Black et al., Integration of Self-Assembled Diblock Copolymers for Semiconductor Capacitor Fabrication, Applied Physics Letters, vol. 79, No. 3, pp. 409-411 (2001).

Sato et al., Novel Antireflective Layer Using Polysilane for Deep Ultraviolet Lithography, J. Vac. Sci. Technol. B, vol. 17, No. 6, pp. 3398-3401 (1999).

Cho et al., Nanoporous Block Copolymer Micelle/Micelle Multilayer Films with Dual Optical Properties, J. Am. Chem. Soc., vol. 128, No. 30, pp. 9935-9942 (2006).

Malenfant et al., Self-Assembly of an Organic-Inorganic Block Copolymer for Nano-Ordered Ceramics, Nature Nanotechnology, vol. 2, pp. 43-46 (2007).

Zhao et al., Colloidal Subwavelength Nanostructures for Antireflection Optical Coatings, Optics Letters, vol. 30, No. 14, pp. 1885-1887 (2005).

Yamaguchi et al., Resist-Pattern Guided Self-Assembly of Symmetric Diblock Copolymer, Journal of Photopolymer Science and Technology, vol. 19, No. 3, pp. 385-388 (2006).

Hadziioannou, Semiconductor Block Copolymers for Self-Assembled Photovoltaic Devices, MRS Bulletin, pp. 456-460 (2002).

Kavakli et al., Single and Double-Layer Antireflection Coatings on Silicon, Turk J Phys, vol. 26, pp. 349-354 (2002).

Fasolka et al., Block Copolymer Thin Films: Physics and Applications1, Annual Review, vol. 31, pp. 323-355 (2001).

Xia et al., An Approach to Lithographically Defined Self-Assembled Nanoparticle Films, Advanced Materials, vol. 18, pp. 930-933 (2006).

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Xu et al., Interfacial Interaction Dependence of Microdomain Orientation in Diblock Copolymer Thin Films, Macromolecules, vol. 38, pp. 2802-2805 (2005).

Xu et al., Electric Field Alignment of Symmetric Diblock Copolymer Thin Films, Department of Polymer Science and Engineering, University of Massachusetts, 5 pages (2003).

Guarini et al., Nanoscale Patterning Using Self-Assembled Polymers for Semiconductor Applications, J. Vac. Sci. Technol. B 19(6), pp. 2784-2788, Nov./Dec. (2001).

Lopes et al., Hierarchical Self-Assembly of Metal Nanostructures on Diblock Copolymer Scaffolds, Nature, vol. 414, Dec. 13, 2001, pp. 735-738.

Horiuchi et al., Three-Dimensional Nanoscale Alignment of Metal Nanoparticles Using Block Copolymer Films as Nanoreactors, Langmuir, vol. 19, pp. 2963-2973 (2003).

Tadd et al, Spatial Distribution of Cobalt Nanoclusters in Block Copolymers, Langmuir, vol. 18, pp. 2378-2384 (2002).

Kuhnline et al., "Detecting thiols in a microchip device using micromolded carbon ink electrodes modified with cobalt phthalocyanine", Analyst, vol. 131, pp. 202-207, (2006).

Sang et al., "Epitaxial self-assembly of block copolymers on lithographically defined nanopatterned substrates", Nature, vol. 24, pp. 411-414, (Jul. 2003).

Written Opinion of the International Searching Authority for International Application No. PCT/US2009/062117 dated Jun. 1, 2010, 3 pages.

International Search Report for International Application No. PCT/US2009/062117 dated Jun. 1, 2010, 3 pages.

Black, Charles T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.

Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.

Guarini, K.W., et al., "Nanoscale patterning using self-assembled polymers for semiconductor applications," J. Vac. Sci. Technol. B, vol. 19, No. 6, pp. 2784-2788, Nov./Dec. 2001.

Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.

Helmuth, Jo A., et al., "High-Speed Microcontact Printing," J. Am. Chem. Soc., vol. 128, No. 29, pp. 9296-9297, 2006.

Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.

Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.

Johnson, Daniel L., et al., "Probing the stability of the disulfide radical intermediate of thioredoxin using direct electrochemistry," Letters in Peptide Science, vol. 10, pp. 495-500, 2003.

Jun, Yongseok, et al., "Microcontact Printing Directly on the Silicon Surface," Langmuir, vol. 18, No. 9, pp. 3415-3417, 2002.

Jun, Yongseok, et al., "Patterning protein molecules on poly(ethylene glycol) coated Si(111)," Biomaterials, vol. 25, pp. 3503-3509, 2004.

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.

Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.

Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.

Niu, Sanjun, et al., "Selective assembly of nanoparticles on block copolymer by surface modification," Nanotechnology, vol. 18, pp. 1-4, 2007.

Park, Sang-Min, et al., "Directed assembly of lamellae-forming block copolymers using chemically and topographically patterned substrates," 16 pages, no date.

Reed, M.A., et al., "Molecular random access memory cell," Appl. Phys. Lett., vol. 78, No. 23, pp. 3735-3737, Jun. 2001.

Rozkiewicz, Dorota I., et al., "'Click' Chemistry by Microcontact Printing," Angew. Chem. Int. Ed., vol. 45, pp. 5292-5296, 2006.

Ruiz, R., et al., "Induced Orientational Order in Symmetric Diblock Copolymer Thin-Films," submitted to Advanced Materials, 12 pages, no date.

Xia, Younan, et al., "Soft Lithography," Annu. Rev. Mater. Sci., vol. 28, pp. 153-184, 1998.

Xu, F.J., et al., "Surface-Initiated Atom Transfer Radical Polymerization from Halogen-Terminated Si(111) (Si-X, X= Cl, Br) Surfaces for the Preparation of Well-Defined Polymer-Si Hybrids," Langmuir, vol. 21, No. 8, pp. 3221-3225, 2005.

Yang et al., Covalently Attached Graft Polymer Monolayer on Organic Polymeric Substrate via Confined Surface Inhibition Reaction, Journal of Polymer Science—A—Polymer Chemistry Edition, Sep. 28, 2006, pp. 745-755, vol. 45, Issue 5.

Zaumseil et al., "Three-Dimensional and Multilayer Nanostructures Formed by Nanotransfer Printing," Nano Letters, 2003, vol. 3, No. 9, pp. 1223-1227.

Zehner, Robert W., et al., "Selective Decoration of a Phase-Separated Diblock Copolymer with Thiol-Passivated Gold Nanocrystals," Langmuir, vol. 14, No. 2, pp. 241-243, Jan. 20, 1998.

Zhang et al., "Self-Assembled Monolayers of Terminal Alkynes on Gold," J. Am. Chem. Soc., vol. 129, No. 16, pp. 4876-4877, 2007.

Zhu, X.Y., et al., "Grafting of High-Density Poly(Ethylene Glycol) Monolayers on Si(111)," Langmuir, vol. 17, pp. 7798-7803, 2001.

Zhu, X.Y., et al., "Molecular Assemblies on Silicon Surfaces via Si-O Linkages," Langmuir, vol. 16, pp. 6766-6772, 2000.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Black et al., Polymer Self Assembly in Semiconductor Microelectronics, IBM J. Res. & Dev. vol. 51, No. 5, Sep. 2007, pp. 605-633.

Krishnamoorthy et al., Block Copolymer Micelles as Switchable Templates for Nanofabrication, Languir, vol. 22, No. 8, Mar. 17, 2006, pp. 3450-3452.

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.

Chai et al., Assembly of Aligned Linear Metallic Patterns on Silicon, Nature Nanotechnology, vol. 2, Aug. 2007, pp. 500-506.

Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.

Krishnamoorthy et al., Nonopatterned Self-Assembled Monolayers by Using Diblock Copolymer Micelles as nanometer-Scale Adsorption and Etch Masks, Advanced Materials, 2008, pp. 1-4.

Park et al., High-Aspect-Ratio Cylindrical Nanopore Arrays and Their Use for Templating Titania Nanoposts, Advanced Materials, vol. 20, pp. 738-742, 2008.

Park et al., Fabrication of Highly Ordered Silicon Oxide Dots and Stripes from Block Copolymer Thin Films, Advanced Materials, vol. 20, pp. 681-685, 2008.

Chen et al., Highly Ordered Arrays of Mesoporous Silica Nanorods with Tunable Aspect Ratios from Block Copolymer Thin Films, Advanced Materials, vol. 20, pp. 763-767, 2008.

Chai et al., Using Cylindrical Domains of Block Copolymers to Self-Assemble and Align Metallic Nanowires, American Chemical Society, www.Acsnano.org, 2008. pp. A-K.

Cha et al, Biomimetic Approaches for Fabricating High-Density Nanopatterned Arrays, Chem. Mater. vol. 19, 2007, pp. 839-843.

PCT International Search Report for Application No. PCT/US2008/060520, dated Sep. 11, 2008, 4 pages.

Yu et al., Contact Printing Beyond Surface Roughness: Liquid Supramolecular Nanostamping, Advanced Materials, vol. 19, 2007, pp. 4338-4342.

Millward et al., U.S. Appl. No. 12/259,921, filed Oct. 28, 2008.

Black, C.T., "Self-aligned self-assembly of multi-nanowire silicon field effect transistors," Appl. Phys. Lett., vol. 87, pp. 163116-1 through 163116-3, 2005.

Clark et al., "Selective Deposition in Multilayer Assembly: SAMs as Molecular Templates," Supramolecular Science, vol. 4, pp. 141-146, (1997).

Gates, "Nanofabrication with Molds and Stamps," Materials Today, pp. 44-49, (Feb. 2005).

Huang et al., "Using Surface Active Random Copolymers to Control the Domain Orientation in Diblock Copolymer Thin Films," Macromolecules, 1998, 31, 7641-7650.

Huang et al., "Stretchable gold conductors on elastomeric substrates," Applied Physics Letters, vol. 82, No. 15, 4 pages.

Trimbach et al., "Block Copolymer Thermoplastic Elastomers for Microcontact Printing," Langmuir, 2003, vol. 19, 5 pages.

* cited by examiner

MULTILAYER ANTIREFLECTION COATINGS, STRUCTURES AND DEVICES INCLUDING THE SAME AND METHODS OF MAKING THE SAME

CROSS-REFERENCE TO RELATED APPLICATIONS

This application is related to U.S. patent application Ser. No. 11/787,928, filed Apr. 18, 2007, now U.S. Pat. No. 7,959,975, issued Jun. 14, 2011. This application is also related to U.S. patent application Ser. No. 12/259,921, filed Oct. 28, 2008, now U.S. Pat. No. 8,097,175, issued Jan. 17, 2012.

FIELD OF THE INVENTION

Embodiments of the invention relate to semiconductor fabrication and, more particularly, to methods of patterning substrates, methods of creating antireflection layers, and devices including the same.

BACKGROUND

Conventional semiconductor processing involves implanting or depositing regions or layers of different material either into or on different regions of a semiconductor substrate. To ensure that the material is positioned at the correct location on the semiconductor substrate, a photo imaging process is conventionally used to define the regions that will subsequently receive the material. The conventional photo imaging process, known as photolithography, may involve projecting light waves onto a photoresist surface so that the light reacts with the photoresist to create an imaged pattern. The photoresist may then be selectively removed as a result of the exposure such that a region of the semiconductor device is exposed to receive the additional material.

In some cases, light waves propagate through the photoresist, reach the underlying substrate, and reflect from the substrate surface back through the photoresist. The reflected light can interfere with other waves propagating through the photoresist and ultimately reduce the accuracy and precision of the image being transferred. In particular, the reflected light can interfere and scatter light waves that are being directed toward a particular region of the photoresist which in turn reduces the effectiveness of exposure intended for the region. As a consequence, the region of the photoresist may not be as uniformly exposed and selective removal of the photoresist during subsequent processing steps may be affected. Furthermore, light reflected from the substrate surface can scatter, especially if the substrate surface is non-planar, such that the scattered light can inadvertently expose the photoresist surrounding the desired region of the photoresist. Thus, the reflected light can expose regions of the photoresist that should otherwise remain unexposed, which limits the ability to precisely define regions of the photoresist for selective removal.

To address this particular problem associated with the photo imaging process, antireflective coatings or layers are commonly used to attenuate or absorb the light waves reflected from the substrate surface during photo exposure operations. Antireflective coatings are materials generally known for their ability to absorb various wavelengths of radiation. They are conventionally interposed between the substrate surface and the photoresist so as to serve as a barrier that inhibits the reflected waves from traversing back through the photoresist and adversely affecting the imaging process. Dielectric antireflective coating (DARC) and bottom antireflective coating (BARC) are examples of antireflective materials that are commonly used to absorb radiation reflected from the substrate surface during the photo imaging operations of integrated circuit processing.

Conventional BARC and DARC layers do not attenuate or absorb all of the light waves and are most effective at absorbing light received from a single angle. In an attempt to improve efficiency of antireflective coatings, double-layer coatings of thin films of SiO, $CeO_2$ and ZnS formed by vacuum evaporation have been utilized. A single-layer antireflective coating may be, for example, 90% effective at absorbing reflected light. A second antireflective coating would absorb 90% of the light that passes through the first single-layer antireflective layer. Thus, a multilayer antireflective coating exponentially increases the amount of reflected light that may be absorbed. However, such structures are cost prohibitive and time intensive as each layer must be individually deposited. Antireflective coatings are also used in other applications and devices such as CMOS imagers and optical devices, with similar limitations. Accordingly, there is a need for affordable multilayer antireflection coatings that may be formed efficiently.

DETAILED DESCRIPTION

Figure 1:
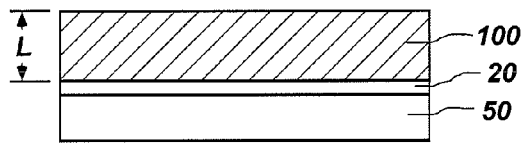
FIG. 1 is a cross-sectional view of an embodiment of the invention including a substrate having a block copolymer cast to a thickness "L" thereon.

The following description with reference to the drawings provides illustrative example of devices and methods according to embodiments of the invention. Such description is for illustrative purposes only and non-limiting of the scope of the invention. Other embodiments of devices and methods in accordance with the invention may be implemented.

Use of self-assembling block copolymers as described herein involves a single annealing step to create a multilayer antireflection layer resulting in a faster and less expensive processing alternative. As stated, conventional BARC and DARC layers do not attenuate or absorb all of the light waves and are most effective at attenuating light received from a single angle. By using multilayer block copolymers with random grain orientation, angular dependence is removed and increased efficiency of the antireflective layer is achieved. Self-assembling block copolymer films spontaneously assemble into periodic structures by microphase separation of the constituent polymer blocks after annealing, for example, by thermal annealing above the glass transition temperature of each block of the copolymer or by solvent annealing, forming domains at nanometer-scale dimensions. In one embodiment, self-assembling block copolymers may be used to create multilayer antireflective layers or coatings on a substrate. The term "substrate" or "semiconductor substrate" or "semiconductive substrate" or "semiconductive wafer fragment" or "wafer fragment" or "wafer" means any construction comprising semiconductor material, including, but not limited to, bulk semiconductive materials such as a semiconductive wafer (either alone or in assemblies comprising other materials). The term "substrate" also refers to any supporting structure including, but not limited to, glass, plastics, semiconductive substrates, wafer fragments, wafers, silicon wafers, silicon-on-insulator ("SOI") substrates, silicon-on-sapphire ("SOS") substrates, epitaxial layers of silicon on a base semiconductor foundation and other semiconductor materials such as silicon-germanium, germanium, gallium arsenide and indium phosphide.

Block copolymers are polymers that include one or more long sequences (i.e., "blocks") of the same monomeric unit(s) covalently bound to one or more long sequences (i.e., "blocks") of unlike type, for example, including differing monomeric unit(s). Block copolymers are conventionally named using the word "-block-" or "-b-" to separate each monomeric unit, while random copolymers are conventionally named using the term "-random-" or an "-r-" to separate each monomeric unit. A wide variety of block copolymers are contemplated herein including diblock copolymers (copolymers having two blocks), triblock copolymers (copolymers having three blocks), multiblock copolymers (copolymers having more than three blocks), and combinations thereof.

In one embodiment, the block copolymer is a diblock copolymer. Diblock copolymers may be symmetric (i.e., the volume fraction of the first diblock copolymer is substantially the same as the volume fraction of the second block) or asymmetric (i.e., the volume fraction of the first block is substantially different than the volume fraction of the second block). As used herein, each block of a symmetric diblock copolymer has a volume fraction of from 0.4 to 0.6. As used herein, each block of an asymmetric diblock copolymer has a volume fraction less than 0.4 or greater than 0.6. Film morphology, including the size and shape of the microphase separated domains may be controlled by the molecular weight and volume fraction of the AB blocks of a diblock copolymer to produce lamellar, cylindrical or spherical morphologies, among others. For example, for volume fractions at ratios greater than about 80:20 of the two blocks (A:B) of a diblock copolymer, a block copolymer film will microphase, separate and self-assemble into periodic spherical domains with spheres of polymer B surrounded by a matrix of polymer A. For ratios of the two blocks between about 60:40 and 80:20, the diblock copolymer assembles into a periodic hexagonal close-packed or honeycombed array of cylinders of polymer B within a matrix of polymer A. For ratios between about 50:50 and 60:40, lamellar domains or alternating stripes of the blocks are formed, which is preferred for the present invention. The domain size preference depends upon the wavelength being attenuated and is generally one-fourth of the wavelength.

The block copolymers may self-assemble in a registered manner to create stacks of alternating planes of lamellar domains oriented substantially parallel to the substrate. In another embodiment, the block copolymers self-assemble in a polycrystalline manner to create a multitude of zones of lamellae, each zone in either a substantially parallel or substantially perpendicular orientation to an underlying substrate. The antireflective layers may be sacrificial and removed, for example, at the same time as a photolithographic mask is removed. In other embodiments, the antireflective layers may remain with the final structure such as, for example, a final antireflective layer in a CMOS imager.

In one embodiment, a diblock copolymer 100 is used as an antireflective film on a substrate to be patterned. Referring to FIG. 1, a symmetric block copolymer 100 may be applied to a substrate 50 by any suitable means, such as spin-coating. Creation of lamellae having a substantially parallel orientation is driven by differences in wetting interactions for each block on a given surface. Sinusoidal fluctuation in block content relative to a surface interface dampens exponentially with distance from the interface and is well understood both theoretically and experimentally. Any material that will selectively permit the diblock copolymer 100 to orient in a parallel manner to a surface thereof may be used for the surface of the substrate 50. However, other materials may be used for the substrate 50 if the substrate is treated with a material that may permit the block copolymer to orient substantially parallel thereto. Thus, the substrate 50 is not limited to any particular material.

For example, to assist the assembly of substantially parallel lamellae, the substrate 50 surface may be preferentially wetted by at least one block of the block copolymer. By "preferential wetting" it is meant that one block of the block copolymer will wet the surface more easily than the other block(s). For any pair of blocks of a copolymer on a surface, the block with the lower interfacial energy with the surface is the "preferentially wetting" block. The magnitude of preferential wetting is defined by the difference in the interfacial energies between the substrate surface and any two blocks of the block copolymer. Referring to FIG. 1, the substrate 50 surface may be modified by depositing a polymer mat or brush 20 on the substrate surface and cross-linking the polymer mat 20. The cross-linked polymer mat 20 may be used, for example, to make the substrate surface preferential wetting with respect to at least one block of a block copolymer.

For example, when the selected block copolymer is poly (styrene-b-methyl methacrylate) (PS-b-PMMA), silicon oxide and clean silicon surfaces (with native silicon oxide) are exemplary substrates that exhibit preferential wetting toward the PMMA block to result in the assembly of a thin interface layer of PMMA as well as alternating PS and PMMA lamellae on a substrate. Other preferentially wetting surfaces to PMMA may be provided, for example, by silicon nitride, SiOC, SiON, SiC, amorphous carbon, W, $WSi_x$, TiN and resist materials such as methacrylate based components. It will be understood that such preferentially wetting materials may comprise the substrate, rather than the cross-linked polymer mat or brush 20. Most surfaces will preferentially wet one block of a block of a block copolymer. Thus, while FIGS. 1-3 include polymer mat or brush 20, it will be understood that this feature is optional.

In certain embodiments, the polymer mat 20 may be a homopolymer. A homopolymer of one block of the diblock copolymer may be grafted to the substrate 50 to provide a surface that is preferentially wetted by the block of the diblock copolymer that is the same as the grafted homopolymer. For example, if the diblock copolymer that will be self-assembled is a polystyrene-b-polymethylmethacrylate diblock copolymer, a polystyrene homopolymer may be grafted to the substrate to provide a surface that is preferentially wetted by the polystyrene block of the diblock copolymer; or a polymethylmethacrylate homopolymer may be grafted to the substrate to provide a surface that is preferentially wetted by the polymethylmethacrylate block of the diblock copolymer. The homopolymers may be grafted by a wide variety of methods known in the art including, for example, preparing homopolymers with end groups (e.g., hydroxyl groups) that may interact (e.g., by forming hydrogen and/or covalent bonds) with the silicon-containing surface.

In certain embodiments, polymer mat 20 may be cross-linked, for example, by exposure to radiation, e.g., ultraviolet (UV) radiation. In some embodiments, the polymer mat 20 being cross-linked may be susceptible to cross-linking without the addition of a cross-linking agent. For example, if the polymer mat 20 is a polystyrene-r-polymethylmethacrylate random copolymer, the polystyrene in the random copolymer may be a cross-linking site upon exposure to UV radiation. Alternatively, a small amount (e.g., 1 mole % to 5 mole %) of thermally cross-linkable monomer (e.g., a benzocyclobutane-containing monomer) or a photochemically cross-linkable monomer (e.g., divinyl benzene) may be included in the polymer mat 20. Alternatively, or in addition to, in some embodiments, a cross-linking agent can be added to polymer mat 20. A wide variety of cross-linking agents are known in the art and include, for example, the combination of a cross-linker (e.g., 1,3,5-trimethyl-2,4,6-(triacetoxymethyl)benzene) and a thermal acid generator (e.g., cyclohexylmethyl (2-oxocyclohexyl)sulfonium trifluoromethanesulfonate). The cross-linked polymer mat 20 preferably has resistance adequate to withstand further processing steps encountered during the block copolymer self-assembly.

By way of non-limiting example, the blocks of the block copolymer may be polybutadiene-polybutylmethacrylate, polybutadiene-polydimethylsiloxane, poly(styrene-b-methyl methacrylate) (PS-b-PMMA), polybutadiene-polymethylmethacrylate, polybutadiene-polyvinylpyridine, polybutylmethacrylate-polybutylacrylate, polybutylmethacrylate-polyvinylpyridine, polybutadiene-polyvinylpyridine, polyethyleneoxide-polyisoprene, polyethyleneoxide-polybutadiene, polyethyleneoxide-polystyrene, polyethylene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polyethylene-polymethylmethacrylate, polymethylmethacrylate-polybutylacrylate, polymethylmethacrylate-polybutylmethacrylate, polystyrene-polybutadiene, polystyrene-polybutylacrylate, polystyrene-polybutylmethacrylate, polystyrene-polybutylstyrene, polystyrene-polydimethoxysiloxane, polystyrene-polyvinylpyridine, polyvinylpyridine-polymethylmethacrylate, polystyrene-b-polyisoprene (PS-b-PI), polystyrene-b-lactic acid, or polyethyleneoxide-polymethylmethacrylate. As described herein, the block copolymer may be a diblock copolymer. However, block copolymers having three (a triblock copolymer) or more (a multiblock copolymer) blocks may also be used. Examples of triblock copolymers include, but are not limited to, poly(styrene-block-methyl methacrylate-block-ethylene oxide) and block copolymers having three or more blocks selected from the following: polystyrene, polymethylmethacrylate, polyethyleneoxide, polyisoprene, polybutadiene, poly lactic acid, polyvinylpyridine, and combinations thereof.

The block copolymer material may also be formulated as a binary, tertiary or ternary blend comprising a self-assembling block copolymer and one or more homopolymers of the same type of polymers as the polymer blocks in the block copolymer, to produce blends that swell the size of the polymers domains and increase the $L_o$ value of the polymer. The volume fraction of the homopolymers may range from 0% to 40%. An exemplary ternary diblock copolymer blend is a PS-b-PMMA/PS/PMMA blend, for example, 18K/18K, 25K/26K or 37K/37K PS-b-PMMA containing 40% 20K polystyrene and 20K poly(methylmethacrylate).

Referring to FIG. 1, the block copolymer 100 may be applied to the substrate 50 to a thickness "L" by conventional techniques including, for example, deposition methods, coating methods, transfer methods, and/or other available application methods. The block copolymer 100 may be applied by spin-coating, dip coating, spray coating, and combinations thereof. In such methods, the block copolymer 100 may be dissolved, dispersed, or suspended in a medium (e.g., a solvent). The solution, dispersion, or suspension may be deposited on the substrate 50, and the medium may be optionally removed (e.g., through evaporation at ambient or elevated temperature, and at ambient or reduced pressure) during or subsequent to deposition.

Figure 2:
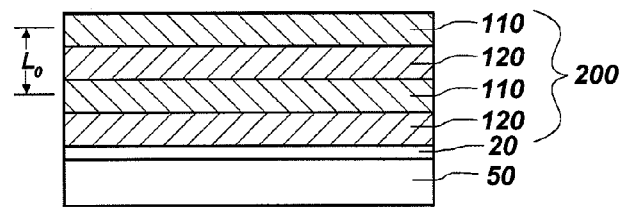
FIG. 2 is a cross-sectional view of an embodiment of the invention including a substrate including a self-assembled block copolymer in a parallel lamellar orientation thereon.

Once the diblock copolymer 100 is deposited on the substrate 50 (or on the polymer mat 20), the diblock copolymer 100 may be annealed to break up existing domains and allow the diblock copolymer 100 to self-assemble (FIG. 2). The diblock copolymer 100 may be annealed by thermal annealing, solvent annealing or a combination thereof. During the annealing, the block polymer may form ordered domains. Thermal annealing may include exposing the diblock copolymer to an elevated temperature (e.g., at or above the glass transition temperature of the diblock copolymer), and, after self-assembly, lowering the temperature to allow the self-assembled diblock copolymer to harden. By way of non-limiting example, the block polymer may be thermally annealed by heating the diblock copolymer to a temperature of from about 0° C. to about 250° C. for up to about 24 hours or longer, preferably under a vacuum or inert atmosphere. Solvent annealing may include exposing the diblock copolymer to a solvent until the block copolymer swells. At least a portion of the solvent may then be removed, such as through evaporation.

The interaction capabilities of the blocks of a block copolymer is referred to with the Greek letter Chi or "X." Chi is an interaction parameter that indicates how chemically distinct each block of the block copolymers is and the energetic cost of mixing the blocks; X*N determines whether the blocks will microphase separate (where N is the chain length of the monomer). The less that each block (AB) of the block copolymer wants to intermingle (i.e., higher Chi), the better the blocks separate and form alternating layers a/b/a/b/a above a substrate. The layers assume a sinusoidal orientation relative to the interface. The sinusoidal effect may be adjusted by selecting a preferential wetting surface and by selecting each block of the block copolymer, based on conventional knowledge, such that the blocks separate rather than intermingle.

Referring to FIG. 2, each block of the diblock copolymer 100 may self-assemble and form alternating lamellae 110 and 120 that are substantially parallel to a major plane of the substrate 50. The alternating lamellae 110 and 120 form multilayer antireflection coating 200. As used herein, "substantially parallel" lamellae refers to a set of lamellae that are, on average, parallel to the surface. In one embodiment, lamellae 110 and 120 have different indices of refraction. Preferably, at least three (3) to six (6) layers of alternating lamellae are formed. More preferably, at least three (3) to twenty (20) layers of alternating lamellae are formed. A three-layered structure formed from diblock copolymer AB would includes layers (or lamellae) A/B/A. The diblock copolymers form substantially continuous, or nonporous, layers on the substrate surface. In an alternate embodiment, one or more blocks of the block copolymer may form porous layers on the substrate surface.

Symmetric diblock copolymers self-assemble into lamellar structures in which alternating lamellae each represent a domain including one block of the diblock copolymer. The distance between the middle of a first domain and the middle of the next domain of the same block type is the inherent periodicity ($L_o$) of the diblock copolymer, which is dependent on the length and/or molecular weight of the polymer chain for each block (FIG. 2). Thus, the inherent periodicity may be increased by increasing the length and/or molecular weight of the polymer chain for one or both blocks of a diblock copolymer. Conversely, the $L_o$ may be decreased by decreasing the length and/or molecular weight of the polymer chain for one or both blocks of a block copolymer. Block copolymers contemplated herein may have an $L_o$ from about 10 nanometers to 100 nanometers. For methods that use a first and second block copolymer, the $L_o$ of the first block copolymer may be the same as or different from the $L_o$ of the second block copolymer. The desired thickness depends on the degree of ordering relative to an interface. If the lamellae are substantially parallel to the substrate 50 throughout the film, then the thickness of the block copolymer is selected to match the pitch (inherent periodicity). Preferential thickness is either an integral multiple of pitch $L_o$ (~$L_o$) or off by one-half $L_o$ (where $(n+\frac{1}{2})L_o$) depending on preferential interface wetting. When both the air and substrate surfaces wet the same block, the preferred thickness is ~$L_o$, when the two interfaces are preferentially wet by opposite blocks, thickness of $(n+\frac{1}{2})L_o$ is preferred. If the lamellae are not substantially parallel to the surface throughout films above a certain thickness, then the films may be any thickness above that minimal value as the regions that are not substantially parallel may be any thickness without an energetic cost.

In certain embodiments, it may be preferable to enhance the stability of the lamellae. Thus, in one embodiment, lamellae 110 and/or 120 may be optionally cross-linked, for example, by exposure to radiation, e.g., ultraviolet (UV) radiation. In some embodiments, the block(s) of the block copolymer being cross-linked may be susceptible to cross-linking without the addition of cross-linking agent. For example, if the block copolymer is a polystyrene-b-polymethylmethacrylate diblock copolymer, the polystyrene block may be cross-linked by exposure to UV radiation. Alternatively, one block of the block copolymer may be made cross-linkable by including a small amount (e.g., 1 mole % to 5 mole %) of thermally cross-linkable monomer (e.g., a benzocyclobutane-containing monomer) or a photochemically cross-linkable monomer (e.g., divinyl benzene) in the block of the copolymer. Alternatively, or in addition to, in some embodiments, cross-linking agent can be added to the lamellae that are to be cross-linked. A wide variety of cross-linking agents are known in the art and include, for example, the combination of a cross-linker (e.g., 1,3,5-trimethyl-2,4,6-(triacetoxymethyl)benzene) and a thermal acid generator (e.g., cyclohexylmethyl(2-oxocyclohexyl)sulfonium trifluoromethanesulfonate). A cross-linked domain may have, for example, improved mechanical robustness.

For methods that use a first and second block copolymer, the first block copolymer and the second block copolymer preferably have different refractive indexes. Each block of a block copolymer may differ from other blocks in the copolymer not only in terms of the structure of monomeric units that form that block, but also in other properties including, for example, physical properties (e.g., mechanical strength, surface tension, wettability, and/or solubility) and chemical properties (e.g., solubility, refractive index, chemical reactivity, susceptibility to removal techniques and/or susceptibility to cross-linking reactions). Chain length of each block copolymer may be conventionally selected based on the desired wavelength to be reflected.

In certain embodiments, at least one block of a block copolymer may be optionally doped or otherwise modified to alter its refractive index. For example, dyes or inorganic materials may be incorporated into at least one block of the block copolymer prior to casting. In one embodiment, a water-insoluble photochromic dye may be incorporated into a hydrophobic core of a block copolymer. In one embodiment, metal-functional monomers may be polymerized to form metal-containing block copolymers. In one embodiment, pre-formed copolymers may be directly blended with metallic nanoparticles, nanoclusters or quantum dots. In yet another embodiment, ligand functional polymers may be prepared by either direct polymerization of ligand functional monomers or by the post-polymerization modification of appropriate precursor polymers.

By way of non-limiting example, a film of annealed, parallel lamellae of polystyrene-b-poly(4-vinylpyridine) may be exposed to a poly(4-vinylpyridine)-selective solvent containing gold molecules. The gold is thus selectively placed in the poly(4-vinylpyridine) domains. The film may then be further exposed to a poly(4-vinylpyridine)-selective solvent containing a reducing agent, which converts the gold molecules to gold nanoparticles in the poly(4-vinylpyridine) domains. In another non-limiting example, one block of a block copolymer (for example, PS-b-PMMA or poly(hydroxylated isoprene) may be exposed to vapors of a metallic species such that the metallic species is selectively incorporated into one block of the block copolymer prior to forming the block copolymer. In yet another non-limiting example, polystyrene-b-poly(4-phenylethynylstyrene) (PS-PPES) may be exposed to cobalt carbonyl in toluene to create cobalt doped PPES. Exemplary metal species include, but are not limited to, gold, platinum, cobalt, iron, palladium, nickel, copper, zinc, ruthenium, silver, rhodium, aluminum, yttrium, chromium, manganese, vanadium, tin, and rhenium. Doping one block of the diblock copolymer with an inorganic material assists in the segregation of the blocks into separate domains and varies the optical properties of the resulting film, which improves the performance of the antireflective layer.

Figure 3:
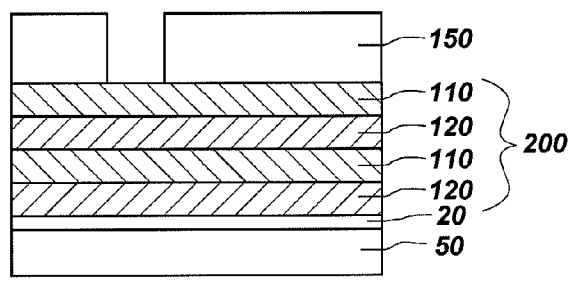
FIG. 3 is a cross-sectional view of an embodiment of the invention including a substrate including a self-assembled block copolymer antireflection layer.

Referring to FIG. 3, following the self-assembly of the diblock copolymer to form a multilayer antireflection coating 200, photoresist 150 may be patterned on an upper surface of the multilayer antireflection coating 200 for conventional photo-imaging. Selected areas of photoresist may be exposed to radiation from a light source to form a desired pattern on the photoresist by conventional techniques. The multilayer antireflection coating 200 will absorb light that has reflected back from the substrate surface, thereby inhibiting the light from traveling through the photoresist. The multilayered composition of the antireflection layer increases the amount of light that is absorbed by the antireflection layer. By selecting each block of the diblock copolymer to have different indices of refraction, the amount of absorbed light may also be increased. After transferring the pattern to the substrate, and etching or otherwise removing a portion of the substrate 50 by conventional techniques, the photoresist 150 and antireflection layer may be removed by conventional techniques resulting in a patterned substrate.

Figure 4:
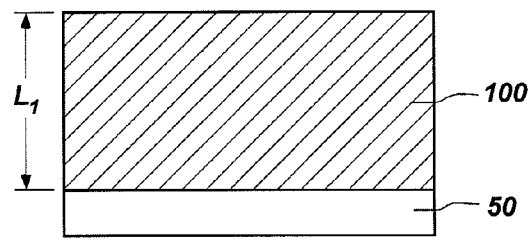
FIG. 4 is a cross-sectional view of an embodiment of the invention including a substrate having a block copolymer cast to a thickness $L_1$ thereon.
Figure 5:
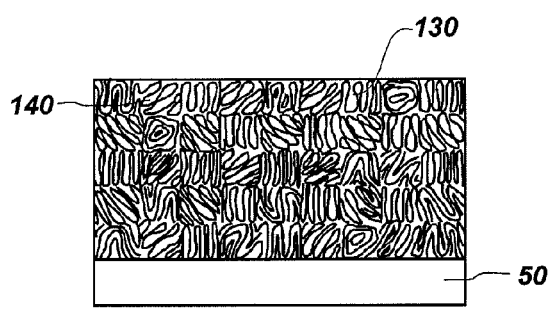
FIG. 5 is a cross-sectional view of an embodiment of the invention including a self-assembled block copolymer having polycrystalline morphology thereon.

An antireflection layer including multiple, planar layers, is best suited for applications in which the light contacts the antireflection layer in a substantially perpendicular orientation. In other embodiments, it may be preferable to include an antireflection layer configured to absorb light from a multitude of angles. For example, in optical applications such as glasses, sunglasses, cut-off filters, binoculars, etc., light may enter through a variety of angles. An antireflection layer configured to attenuate light from a multitude of angles may also be useful when patterning a substrate. Thus, in one embodiment, a block copolymer 100 may be applied to a substrate 50 where the domain size "$L_1$" (thickness) of each block over a substrate is $\lambda/4$ (where $\lambda$ is the wavelength used) (FIG. 4). An annealing step may be performed, but is not required provided that adequate self-assembly occurs during spin-coating. The volatility of the solvent used for spin-coating will impact this. Thin films prepared on a neutral-wetting substrate and annealed do not have any preferential orientation of domains and will assemble into a disordered fingerprint-like structure despite extensive annealing as shown in FIG. 5. As shown in FIG. 5, domains are created such that a first domain 130 is oriented substantially perpendicular to a major plane of the underlying substrate 50 and a second domain 140 is oriented substantially parallel to the major plane of substrate 50.

Figure 9:
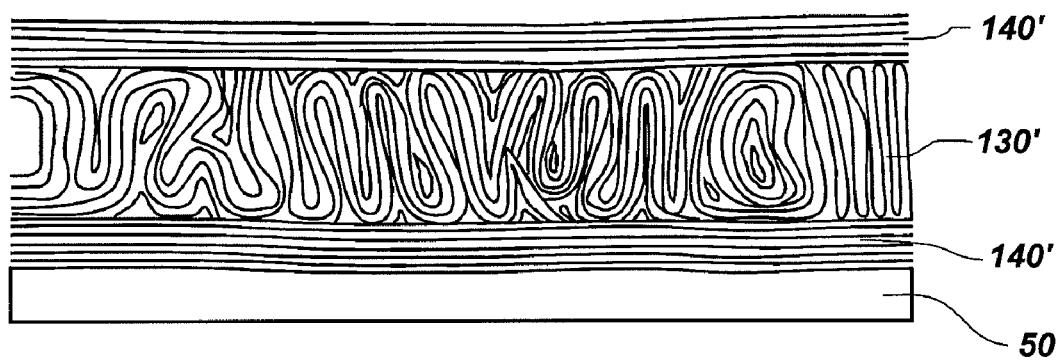
FIG. 9 is a cross-sectional view of an embodiment of the invention including a self-assembled block copolymer having polycrystalline morphology thereon.

Referring to FIG. 9, when using thicker films where the dimensions of an inner section are greater than the grain size (e.g., average distance over which all the lamellae are oriented more or less identically), and the regions proximate the interfaces will be substantially parallel 140' to the interfaces, the self-assembled polymer in the center of the film is mostly oriented in a quasi-perpendicular morphology 130' relative to substrate 50, with some bending and the formation of T-junctions where the parallel and perpendicular regions overlap.

Figure 6:
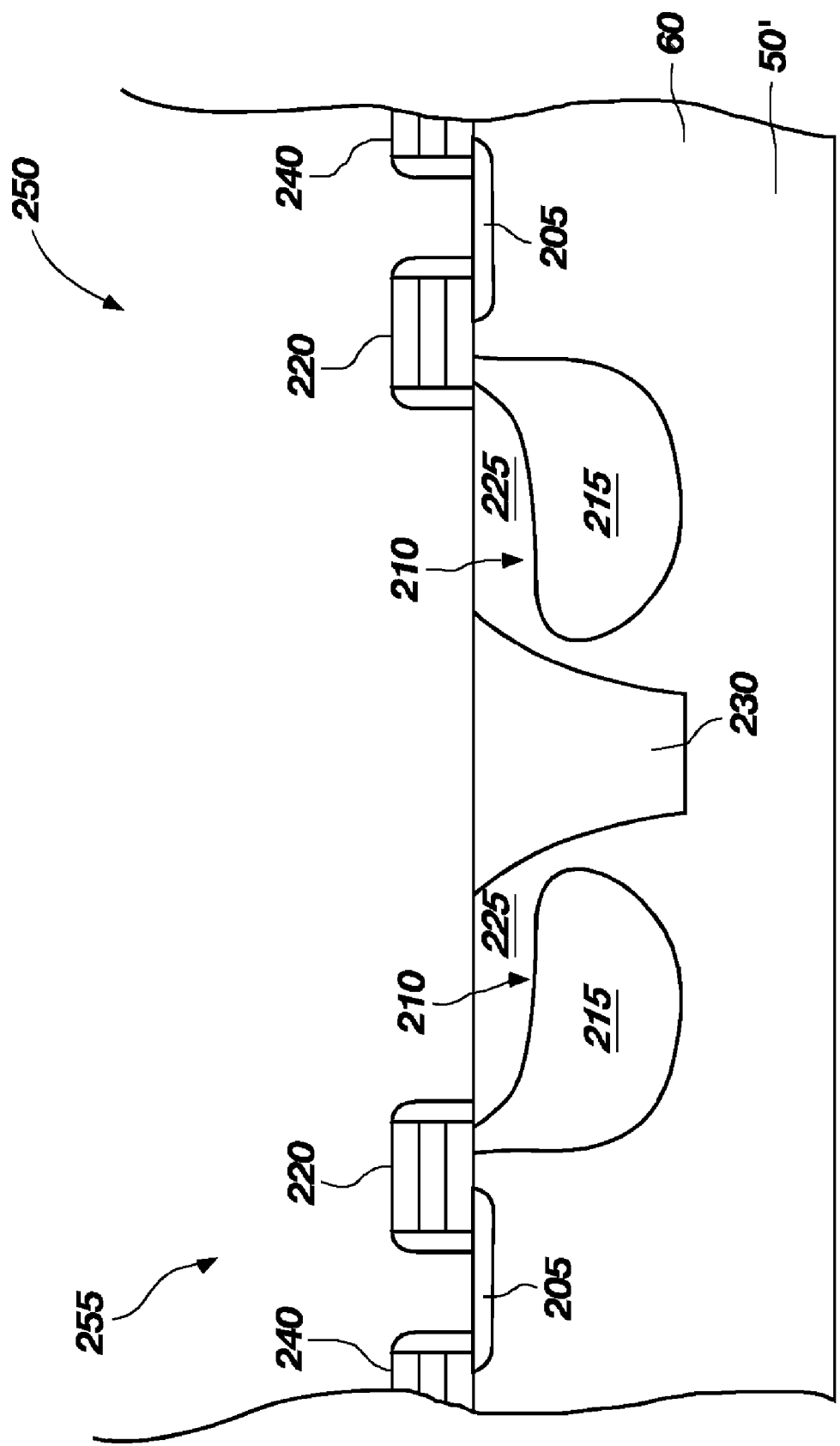
FIG. 6 is a cross-sectional view of an embodiment of the invention including a portion of a conventional CMOS image sensor including photodiodes of two CMOS image sensor pixels.

In one embodiment, a complementary metal oxide semiconductor (CMOS) imager includes a multilayer antireflection coating including self-assembled block copolymers. The preliminary process steps of forming a CMOS imager may proceed by conventional methods. FIG. 6 illustrates an exemplary view of a portion of a conventional CMOS image sensor four-transistor (4T) pixel. The exemplary CMOS image sensor includes two adjacent pixels 250, 255 and a light-sensing element, shown as a photodiode 210, that may be formed having a photosensitive p-n junction region comprising a p-type surface layer 225 and an n-type photodiode region 215 within a p-type region 60. P-type region 60 may be formed on substrate 50'. It will be understood that the light-sensing element is not restricted to a photodiode, but may be selected from any light-sensing element including, without limitation, photogates, pinned photodiodes, partially pinned photodiodes, etc. Further, while a 4T pixel is shown, it will be understood that the self-assembled block copolymer antireflection coating may be incorporated into any CMOS or CCD (charge-coupled device) image sensors.

In a conventional CMOS image sensor, photodiodes 210 may be separated by isolation region 230, for example, a field oxide or short trench isolation. The trench isolation region may be conventionally formed in a p-well active layer in a p-type region 60 adjacent to n-type photodiode region 215 to isolate the pixels 250, 255. The n-type photodiode region 215 may function as a charge collection region of a photodiode 210 for collecting charges generated by light incident on a pixel. A conventional CMOS image sensor may also include a transfer transistor having a gate 220 for transferring photoelectric charges from the charge collection region to the floating diffusion region 205. The CMOS image sensor may also include a reset transistor having a gate 240. It will be understood that gate stacks for the pixel transistors may be formed before or after the trench isolation regions are formed. The order of these preliminary process steps may be varied as is required or convenient for a particular process flow.

Figure 7:
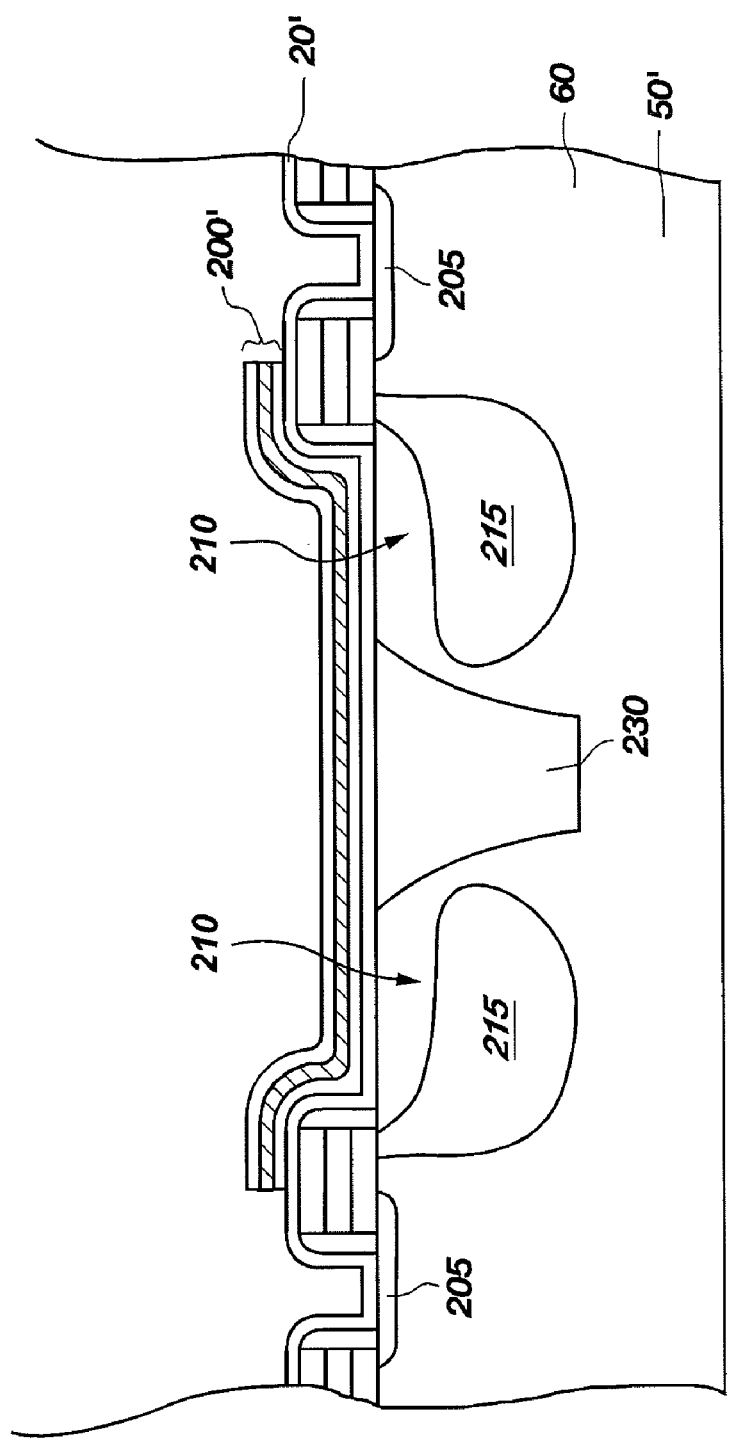
FIG. 7 is a cross-sectional view of an embodiment of the invention including a CMOS image sensor pixel including a self-assembled block copolymer having antireflection coating thereon.

As incident light strikes the photodiode 210, some portion is reflected (i.e., not sensed by the photodiode 210). Thus, referring to FIG. 7, in one embodiment, a multilayer antireflection layer or coating 200' may be used to minimize the amount of light reflected from the photodiode 210. A block copolymer may be deposited over the CMOS image sensor as described herein. In one embodiment, the block copolymer is deposited to a thickness of 1 µm to 10 µm. In an embodiment depicted in FIG. 7, the block copolymer may be cast under conditions that allow the block copolymer to self-assemble into lamellae that are substantially parallel to the underlying substrate 50'. Thus, as described, a polymer mat 20' may be required to create a preferential wetting surface for the block copolymer. After deposition, the block copolymer may be annealed to form a multilayer antireflection coating 200' and then selectively etched, or otherwise patterned, such that the multilayer antireflection coating 200' is only present over the photodiode 210. Alternatively, after deposition, the block copolymer may be annealed to form a multilayer antireflection coating 200' over the entire device. The CMOS imager may then be subjected to further conventional processing such as, for example, deposition of an oxide layer thereover.

Figure 8:
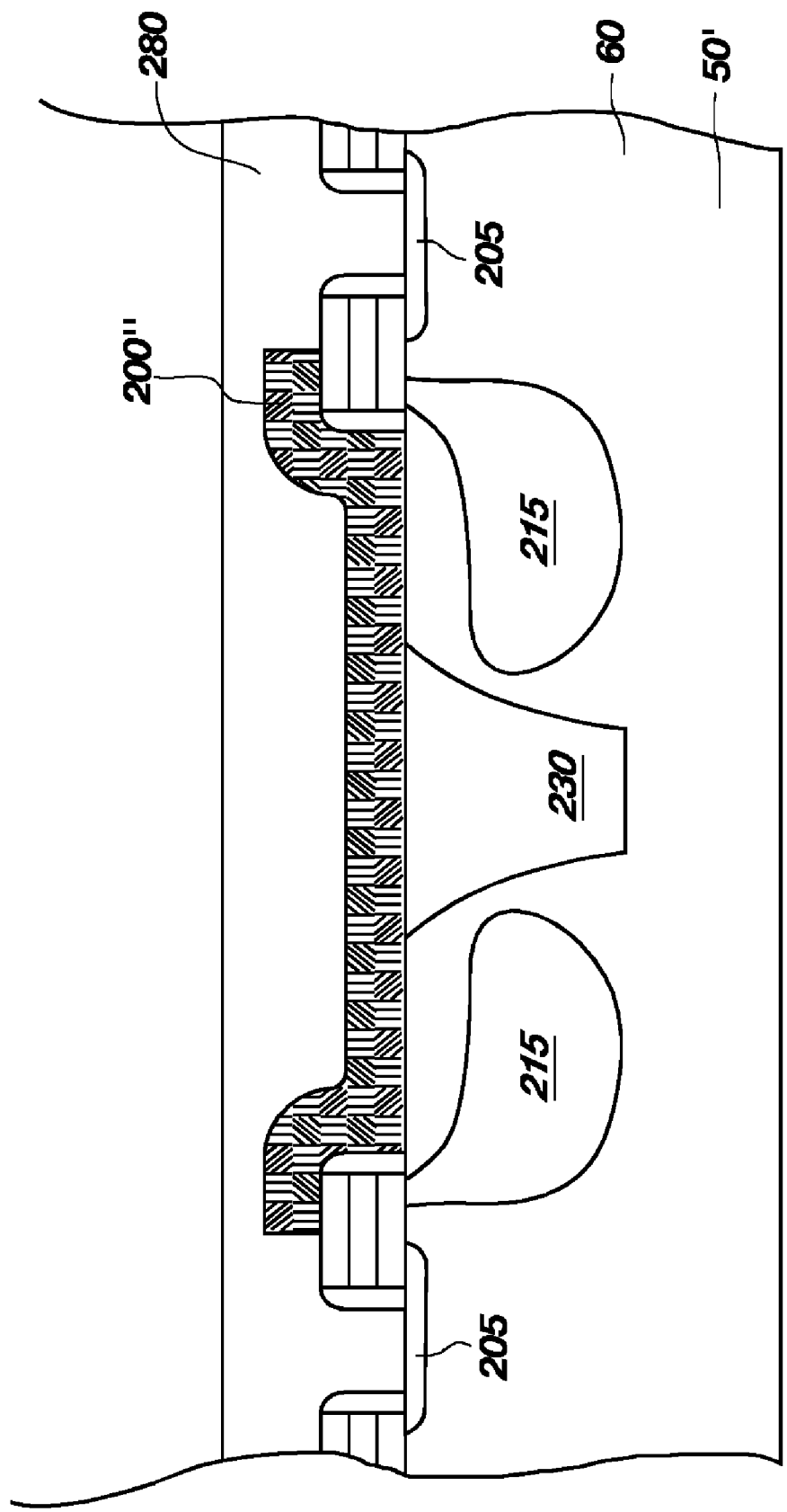
FIG. 8 is a cross-sectional view of an embodiment of the invention including a CMOS image sensor pixel including a self-assembled block copolymer having antireflection coating thereon.

Referring to FIG. 8, in one embodiment, the antireflection coating 200" includes a plurality of block copolymer domains randomly oriented either parallel or perpendicular to the major plane of an underlying substrate 50'. A block copolymer may be applied to the substrate 50' at a thickness of 1 µm to 100 µm and an annealing step may be optionally performed. Thin films prepared on a flat substrate and annealed do not have any preferential orientation of domains and will assemble into a disordered fingerprint-like structure despite extensive annealing as shown and described in FIG. 5. The CMOS imager may then be subjected to further conventional processing such as, for example, deposition of an oxide layer 280 thereover.

The invention may be further understood by the following non-limiting examples.

Example 1

A film of lamellar-forming PS-PMMA ($M_n$=71.9 Kg/mol, PDI=1.06, inherent periodicity or pitch $\{L_o\}$ of ~30 nm) is coated at a thickness of 315 nm ($10.5*L_o$) onto a substrate which preferentially wets the PMMA domain and the difference in interfacial energies for PS and PMMA with the substrate is 0.75 ergs/cm$^2$. The film is thermally annealed above the glass transition temperature of the blocks under an inert atmosphere for sufficient time to induce ordered self-assembly relative to the substrate and air interfaces, e.g., 24 hours at 250° C. The lamellar structures assemble so that PMMA wets the substrate interface and PS wets the air interface to form ten and one-half periods or twenty total PS-PMMA interfaces with a domain size for each lamellar plane of 15 nm. The $L_o$ value (and corresponding domain size) may be increased by using either higher molecular weight block copolymer or creating a ternary blend of the PS-PMMA block copolymer with homopolymers of PS and PMMA. If the difference in interfacial energies for PS and PMMA with the substrate is >0.75 ergs/cm², the number of periods in the film may be increased in proportion with the increase in surface energy differential.

Example 2

A film of lamellar-forming PS-PMMA ($M_n$=71.9 Kg/mol, PDI=1.06, inherent periodicity or pitch {$L_o$} of ~30 nm) is coated at a thickness of 795 nm (26.5*$L_o$) onto a substrate which preferentially wets the PMMA domain and the difference in interfacial energies for PS and PMMA with the substrate is ≦0.5 ergs/cm². The film is thermally annealed above the glass transition temperature of the blocks under an inert atmosphere for sufficient time to induce ordered self-assembly relative to the substrate and air interfaces, e.g., 24 hours at 250° C. The lamellar structures assemble so that PMMA wets the substrate interface to a distance of ≦3 pitches (six PS-PMMA interfaces) with 100% parallel domains, and PS wets the air interface to form two to three pitches (four to six PS-PMMA interfaces) of 100% parallel domains relative to the air interface. The self-assembled polymer in the center of the film is mostly oriented in a quasi-perpendicular morphology relative to the substrate, with some bending and the formation of T-junctions where the parallel and perpendicular regions overlap (see, e.g., FIG. 9). The $L_o$ value (and corresponding domain size) can be increased by using either higher molecular weight block copolymer or creating a ternary blend of the PS-PMMA block copolymer with homopolymers of PS and PMMA.

Example 3

A substrate is grafted with a random PS-r-PMMA copolymer with a fractional mol % of PS of ≦60% such that the surface energy differential for homopolymers of PS and PMMA is around 0.0625 ergs/cm². A blend is prepared of PS-b-PMMA $M_n$=71.9 Kg/mol, PDI=1.06, inherent periodicity or pitch {$L_o$} of ~30 nm) and (α-perfluorodacanoyl-ω-TEMPO)-PS-r-PMMA with a fractional mol % of PS approximately equal to that of the surface grafted PS-r-PMMA. As the fluorinated alkyl tail of the random copolymer preferentially wets an air interface, during an anneal procedure this material preferentially migrate to that interface and orient such that the PS-r-PMMA segments interact with the block copolymer. The synthesis and use of such materials is described in Huang, E. et al., "*Using Surface Active Random Copolymers To Control the Domain Orientation in Diblock Copolymer Thin Films*," Macromolecules, 1998, 31, 7641-7650. The composition of the blend is defined so that for a given total film thickness spun-cast from a solution of the blend over a nanometer-square area, the (α-perfluorodacanoyl-ω-TEMPO)-PS-r-PMMA will account for 6 nm³ of the volume of film. The blended film is thermally annealed above the glass transition temperature of the blocks under an inert atmosphere for sufficient time to induce ordered self-assembly relative to the substrate and air interfaces, e.g., 24 hours at 250° C.; the (α-perfluorodacanoyl-ω-TEMPO)-PS-r-PMMA will phase segregate to the air interface selectively. The surface energy differentials for the block copolymer at the surface and "air" interfaces are projected to provide no exclusive bias toward either parallel or perpendicular structures, and so the bounded block copolymer thin film will self-assemble as the material in bulk, with no long-range ordering or preferred orientation to interfaces (see, e.g., FIG. 5).

Example 4

A film of lamellar forming polystyrene-block-poly(4-vinylpyridine) or PS-b-P4VP (21 400 g/mol and 20 700 g/mol, respectively, PDI 1.14, inherent periodicity or pitch {$L_o$} of 33 nm) is coated onto a silicon oxide surface at a thickness of 5.5*33 nm=181.5 nm and annealed at 180° C. for 36 hours in a vacuum oven. The lamellar structures self-assemble so that a P4VP domain wets the substrate interface and a PS domain wets the air interface, forming ten interfaces between the domains in the film. The film is soaked in a 1% solution of hydrogen tetrachloroaurate(III) {$HAuCl_4$} in ethanol for up to 10 minutes; this selectively impregnates the P4VP domains with gold species. The film is then placed in a 1% solution of sodium borohydride {$NaBH_4$} in ethanol for up to 30 seconds to reduce the hydrogen tetrachloroaurate to gold nanoparticles ~3 nm in diameter located exclusively in the P4VP domains.

The invention is susceptible to various modifications and alternative forms in addition to specific embodiments shown by way of example in the drawings and described in detail herein. Thus, the invention is not limited to the particular forms disclosed. Rather, the scope of the invention encompasses all modifications, equivalents, and alternatives falling within the following appended claims.

What is claimed is:

1. A structure, comprising a polymer mat on a substrate and a multilayer antireflection coating over the polymer mat, the multilayer antireflection coating comprising a plurality of self-assembled block copolymer domains including a plurality of zones of lamellae, each domain of the plurality of self-assembled block copolymer domains being above or below an adjacent domain of the plurality of self-assembled block copolymer domains.

2. The structure of claim 1, wherein the polymer mat is cross-linked.

3. The structure of claim 1, wherein a first block of the self-assembled block copolymer has a different index of refraction than a second block of the block copolymer.

4. The structure of claim 1, wherein the self-assembled block copolymer is selected from the group consisting of polybutadiene-polybutylmethacrylate, polybutadiene-polydimethylsiloxane, poly(styrene-b-methyl methacrylate) (PS-b-PMMA), polybutadiene-polymethylmethacrylate, polybutadiene-polyvinylpyridine, polybutylmethacrylate-polybutylacrylate, polybutylmethacrylate-polyvinylpyridine, polybutadiene-polyvinylpyridine, polyethyleneoxide-polyisoprene, polyethyleneoxide-polybutadiene, polyethyleneoxide-polystyrene, polyethylene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polyethylene-polymethylmethacrylate, polymethylmethacrylate-polybutylacrylate, polymethylmethacrylate-polybutylmethacrylate, polystyrene-poly butadiene, polystyrene-polybutylacrylate, polystyrene-polybutylmethacrylate, polystyrene-polybutylstyrene, polystyrene-polydimethoxysiloxane, polystyrene-polyvinylpyridine, polyvinylpyridine-polymethylmethacrylate, polystyrene-b-polyisoprene (PS-b-PI), polystyrene-b-lactic acid, and polyethyleneoxide-polymethylmethacrylate.

5. The structure of claim 1, wherein a first block of the self-assembled block copolymer is doped with a dopant selected from the group consisting of a water-insoluble photochromic dye, gold, platinum, cobalt, iron, palladium, nickel, copper, zinc, ruthenium, silver, rhodium, aluminum, chromium, manganese, yttrium and rhenium.

6. The structure of claim 1, wherein a first zone of lamellae is oriented substantially parallel to a major plane of the substrate and wherein a second zone of lamellae is oriented substantially perpendicular to the major plane.

7. A CMOS imaging device, comprising:
a field isolation region formed in a substrate;
a first gate and a second gate flanking opposite sides of the field isolation region;
a polymer mat over the substrate; and
a multilayer antireflection coating over the polymer mat and at least partially covering the first gate, the field isolation region and the second gate, the multilayer antireflection coating comprising a plurality of alternating layers of a self-assembled block copolymer, wherein a first block of the self-assembled block copolymer has a different index of refraction than a second block of the self-assembled block copolymer.

8. The CMOS imaging device of claim 7, wherein the multilayer antireflection coating comprises a plurality of zones of lamellae, each zone of the plurality of zones oriented substantially parallel or substantially perpendicular to a major plane of the substrate.

9. The CMOS imaging device of claim 7, further comprising an oxide layer disposed over the multilayer antireflection coating.

10. A CMOS imaging device, comprising:
a field isolation region formed in a substrate; a first gate and a second gate flanking opposite sides of the field isolation region;
a polymer mat over the substrate; and
a non-porous multilayer antireflection coating over the polymer mat and at least partially covering the first gate, the field isolation region and the second gate, the multilayer antireflection coating comprising a self-assembled block copolymer, wherein a first block of the self-assembled block copolymer has a different index of refraction than a second block of the self-assembled block copolymer.

11. An electronic device, comprising a polymer mat on a substrate and a self-assembled block copolymer over the polymer mat, the self-assembled block copolymer including a plurality of zones of lamellae, a first zone of lamellae of the plurality of zones of lamellae proximate an air interface and a third zone of lamellae below the first zone of lamellae and proximate an interface with the substrate.

12. The electronic device of claim 11, wherein the first zone of lamellae is substantially parallel to the air interface.

13. The electronic device of claim 11, wherein the third zone of lamellae of the plurality of zones of lamellae is substantially parallel to the interface with the substrate.

14. The antireflection device of claim 13, wherein a second zone of lamellae of the plurality of zones of lamellae is present between the first zone and the third zone.

15. The electronic device of claim 14, wherein a first zone of lamellae is oriented substantially parallel to a lateral extent of the multilayer antireflection film and wherein the second zone of lamellae is oriented substantially perpendicular to the lateral extent.

* * * * *